US008308870B2

(12) United States Patent
Minami et al.

(10) Patent No.: US 8,308,870 B2
(45) Date of Patent: Nov. 13, 2012

(54) CLEANING APPARATUS, CLEANING METHOD AND RECORDING MEDIUM

(75) Inventors: Teruomi Minami, Kumamoto (JP); Takashi Yabuta, Saga (JP); Satoru Tanaka, Kumamoto (JP); Hirotaka Maruyama, Koshi (JP); Kouichi Eguchi, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 311 days.

(21) Appl. No.: 12/610,599

(22) Filed: Nov. 2, 2009

(65) Prior Publication Data

US 2010/0108103 A1    May 6, 2010

(30) Foreign Application Priority Data

Nov. 5, 2008    (JP) .................................. 2008-284532

(51) Int. Cl.
*B08B 3/08*    (2006.01)

(52) U.S. Cl. ............ 134/22.18; 134/23; 134/26; 134/33; 134/34

(58) Field of Classification Search ........................ None
See application file for complete search history.

(56) References Cited

U.S. PATENT DOCUMENTS

| 2007/0089767 | A1* | 4/2007 | Yamamoto ..................... 134/149 |
| 2007/0119476 | A1* | 5/2007 | Hara et al. ..................... 134/1.3 |
| 2009/0056764 | A1* | 3/2009 | Minami et al. ................. 134/27 |

FOREIGN PATENT DOCUMENTS

| JP | 09-270376    | * | 10/1997 |
| JP | 10-303173 A  |   | 11/1998 |
| JP | 2000-114219  | * | 4/2000  |
| JP | 2004-304138 A|   | 10/2004 |
| JP | 2009-141280 A|   | 6/2009  |
| JP | 2009-206359 A|   | 9/2009  |

OTHER PUBLICATIONS

Machine Translation of JP09-270376 by Okamoto, published Oct. 14, 1997.*
Machine Translation of JP2000-114219 by Takahashi, published Apr. 21, 2000.*

* cited by examiner

*Primary Examiner* — Michael Kornakov
*Assistant Examiner* — Ryan Coleman
(74) *Attorney, Agent, or Firm* — Abelman, Frayne & Schwab (57) ABSTRACT

Disclosed are a cleaning apparatus and a cleaning method, which can collect a chemical liquid without reducing the throughput after a substrate is subjected to a cleaning treatment and dried by using a drying solvent, such as IPA. The disclosed cleaning apparatus carries out a chemical liquid cleaning treatment, a rinsing treatment, and a drying treatment with IPA, in order, on a wafer W while rotating wafer W, and includes a cleaning liquid supply device for supplying a cleaning liquid for cleaning the drain cup and the drain tube to the drain cup in a state where the cleaning liquid is not supplied to the wafer. Also, the apparatus further includes a control unit for controlling respective components of the cleaning apparatus. The control unit, after the cleaning treatment and then the rinsing treatment of wafer W, at the time when the drying treatment is performed by IPA, controls the cleaning liquid to be supplied to the drain cup.

10 Claims, 11 Drawing Sheets

CLEANING APPARATUS, CLEANING METHOD AND RECORDING MEDIUM

This application is based on and claims priority from Japanese Patent Application No. 2008-284532, filed on Nov. 5, 2008, with the Japanese Patent Office, the disclosure of which is incorporated herein in its entirety by reference.

TECHNICAL FIELD

The present disclosure relates to a cleaning apparatus for performing a cleaning treatment on a substrate, such as a semiconductor wafer, a cleaning method, and a computer-readable recording medium.

BACKGROUND

In a process of fabricating a semiconductor device or a flat panel display (FPD), a process for performing liquid-treatment by supplying a processing liquid to a target substrate, such as a semiconductor wafer or a glass substrate, has been widely used. For example, such a process may include a cleaning treatment for removing fine particles or contaminants adhered to a substrate.

As a cleaning apparatus for performing such a cleaning treatment, there has been known a single wafer type cleaning apparatus in which while a substrate (such as a semiconductor wafer) is held by a spin chuck and is rotated, the treatment is performed by discharging a chemical liquid from a nozzle to the surface of the substrate to form a liquid film on the surface of the substrate. After the cleaning treatment with the chemical liquid, while the substrate is rotated, a rinsing treatment is performed by supplying deionized water, as a rinsing liquid, to the surface of the substrate, followed by a drying treatment. The drying treatment is performed by shaking off the remaining rinsing liquid through high-speed rotation of the substrate without the supply of any liquid. In order to avoid remnants, such as watermarks, prior to the shaking-off drying treatment, a solvent having a low boiling point and a low surface tension, such as isopropyl alcohol (IPA), is supplied, as a drying solvent, to the substrate. For example, see Japanese Laid-Open Patent Publication No. HEI 10-303173.

However, in such a kind of cleaning apparatus, since a liquid is shaken off from the substrate, a drain cup is provided around the substrate to receive the shaken-off liquid, and a drain tube connected to the bottom portion of the drain cup is provided to discharge the liquid to the outside of the apparatus. The drain cup receives all of a chemical liquid for cleaning, a rinsing liquid (such as deionized water), and a drying solvent (such as IPA) and discharges them to the drain tube.

In general, after the drying treatment is performed by using a drying solvent, such as IPA, a chemical liquid treatment on the subsequent substrate is performed without a rinsing treatment. This causes IPA and the like to remain in the drain cup or the drain tube. In this state, when the chemical liquid treatment on the subsequent substrate is performed, the draining liquid of the chemical liquid is mixed with IPA and the like. Since many chemical liquids used for the cleaning treatment are expensive, the chemical liquids have been recently required to be collected and reused. However, since the above mentioned chemical liquid mixed with IPA and the like cannot be reused, it is wasted. When the chemical liquid is wasted, a waste liquid disposal apparatus is used. Thus, the waste, instead of reuse, of such a chemical liquid causes overload of the waste liquid disposal apparatus.

SUMMARY

According to one embodiment, there is provided a cleaning apparatus. The cleaning apparatus includes a holding device to rotatably hold a substrate, a rotation device to rotate the holding device, a chemical liquid supply device to supply a chemical liquid for performing a cleaning treatment to the substrate held by the holding device, a rinsing liquid supply device to supply a rinsing liquid for performing a rinsing treatment to the substrate held by the holding device after cleaning of the substrate, a drying solvent supply device to supply a drying solvent for performing a drying treatment to the substrate held by the holding device after rinsing of the substrate, a drain cup to receive draining liquid of at least one of the chemical liquid, the rinsing liquid, and the drying solvent shaken off from the substrate, a drain tube to drain off at least one of the chemical liquid, the rinsing liquid, and the drying solvent received in the drain cup, a cleaning liquid supply device to supply a cleaning liquid to clean the drain cup and the drain tube to the drain cup in a state where the cleaning liquid is not supplied to the substrate, and a control unit to control the rotation device, the chemical liquid supply device, the rinsing liquid supply device, the drying solvent supply device, and the cleaning liquid supply device. The drain cup surrounds a circumferential periphery of the substrate held by the holding device. Under control of the control unit, the cleaning treatment of the substrate by the chemical liquid and then the rinsing treatment of the substrate by the rinsing liquid are performed while the substrate is rotated. Thereafter, the drying treatment of the substrate is performed by supplying the drying solvent to the substrate while the substrate is rotated. Then, the cleaning liquid is supplied to the drain cup at a time when the drying treatment is performed.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure provides a cleaning apparatus and a cleaning method, which can collect a chemical liquid without reducing the throughput when a substrate is subjected to a cleaning treatment and then is dried by using a drying solvent, such as IPA. Also, the present disclosure provides a recording medium in which a program for executing such a cleaning method is recorded.

According to one embodiment, there is provided a cleaning apparatus. The cleaning apparatus includes a holding device to rotatably hold a substrate, a rotation device to rotate the holding device, a chemical liquid supply device to supply a chemical liquid for performing a cleaning treatment to the substrate held by the holding device, a rinsing liquid supply device to supply a rinsing liquid for performing a rinsing treatment to the substrate held by the holding device after cleaning of the substrate, a drying solvent supply device to supply a drying solvent for performing a drying treatment to the substrate held by the holding device after rinsing of the substrate, a drain cup to receive draining liquid of at least one of the chemical liquid, the rinsing liquid, and the drying solvent shaken off from the substrate, a drain tube to drain off at least one of the chemical liquid, the rinsing liquid, and the drying solvent received in the drain cup, a cleaning liquid supply device to supply a cleaning liquid to clean the drain cup and the drain tube to the drain cup in a state where the cleaning liquid is not supplied to the substrate, and a control unit to control the rotation device, the chemical liquid supply device, the rinsing liquid supply device, the drying solvent supply device, and the cleaning liquid supply device. The drain cup surrounds a circumferential periphery of the substrate held by the holding device. Under control of the control unit, the cleaning treatment of the substrate by the chemical liquid and then the rinsing treatment of the substrate by the rinsing liquid are performed while the substrate is rotated. Thereafter, the drying treatment of the substrate is performed by supplying the drying solvent to the substrate while the substrate is rotated. Then, the cleaning liquid is supplied to the drain cup at a time when the drying treatment is performed.

Under the control of the control unit, the cleaning liquid may be supplied to the drain cup from when the supply of the drying solvent to the substrate is stopped to when the substrate is exchanged with a subsequent substrate.

The cleaning liquid supply device may have a cleaning liquid tube extended from a lower portion of the drain cup to vicinity of a bottom portion of the drain cup, and supply the cleaning liquid into the drain cup through the cleaning liquid tube. In this, the cleaning liquid tube may discharge the cleaning liquid in a rotational direction of the substrate. Also, the cleaning liquid supply device may have a cleaning liquid tube inserted from outside of the drain cup to a position in vicinity of a bottom portion and a drain hole of the drain cup so as to discharge the cleaning liquid. In any case, the cleaning liquid, discharged from the cleaning liquid tube, may be discharged from a drain hole after circulating on the drain cup.

The drain tube may be provided with a valve. Under the control of the control unit, storage of the cleaning liquid in the drain cup and the drain tube, and discharge of the cleaning liquid stored in the drain cup and the drain tube, may be alternately performed. The storage of the cleaning liquid may be performed by supplying of the cleaning liquid to the drain cup by the cleaning liquid supply device with the valve being closed. The discharge of the cleaning liquid may be performed by opening of the valve. Also, under the control of the control unit, the cleaning liquid may be supplied to the drain cup from the cleaning liquid supply device while a draining liquid flows from the drain tube. Thereafter, the storage and the discharge of the cleaning liquid may be alternately performed.

Also, the cleaning apparatus may further include a rotation cup surrounding the substrate held by the holding device. The rotation cup is rotatable together with the substrate. Under the control of the control unit, prior to the cleaning treatment of the substrate by the chemical liquid, a rinsing treatment may be performed by a rinsing liquid while the substrate is rotated, thereby cleaning an inner surface of the rotation cup.

According to another embodiment, there is provided a cleaning method. The cleaning method performs a cleaning treatment on a substrate in a state where the substrate is rotatably held by a holding device, a drain cup to receive a draining liquid shaken off from the substrate is disposed surrounding a circumferential periphery of the substrate held by the holding device, and a drain tube to discharge the draining liquid within the drain cup is provided in the drain cup. The cleaning method includes a cleaning step to clean the substrate by supplying a chemical liquid to the substrate during rotation of the substrate, a rinsing step, after the cleaning step, to perform a rinsing treatment of the substrate by supplying a rinsing liquid to the substrate during rotation of the substrate, a drying step, after the rinsing step, to perform a drying treatment of the substrate by supplying a drying solvent to the substrate during the rotation of the substrate, and a cleaning step to clean the drain cup and the drain tube by supplying a cleaning liquid from a cleaning liquid supply device to the drain cup in a state where the cleaning liquid is not supplied to the substrate, at a time when the drying step is performed.

In the cleaning step to clean the drain cup and the drain tube, the cleaning liquid may be supplied to the drain cup from when the supply of the drying solvent to the substrate is stopped to when the substrate is exchanged with a subsequent substrate. In the cleaning step to clean the drain cup and the drain tube, the cleaning liquid may be supplied to the drain cup during the rinsing step to perform a rinsing treatment of the substrate.

In the cleaning step to clean the drain cup and the drain tube, the cleaning liquid may be discharged in a rotational direction of the substrate. Also, in the cleaning step to clean the drain cup and the drain tube, the cleaning liquid may be discharged into the drain cup and then discharged from the drain cup after circulating on the drain cup.

In the cleaning step to clean the drain cup and the drain tube, the drain tube may be provided with a valve. In the cleaning step to clean the drain cup and the drain tube, storage of the cleaning liquid in the drain cup and the drain tube, and discharge of the cleaning liquid stored in the drain cup and the drain tube, may be alternately performed. The storage of the cleaning liquid may be performed by supplying of the cleaning liquid to the drain cup by the cleaning liquid supply device with the valve being closed. The discharge of the cleaning liquid may be performed by opening of the valve. Also, in the cleaning step to clean the drain cup and the drain tube, the cleaning liquid may be supplied to the drain cup from the cleaning liquid supply device while a draining liquid flows from the drain tube. Thereafter, the storage and the discharge of the cleaning liquid may be alternately performed.

A rotation cup surrounding the substrate held by the holding device may be disposed. The rotation cup is rotatable together with the substrate. The cleaning method may further includes, prior to the cleaning treatment of the substrate with the chemical liquid, a cleaning step to clean an inner surface of the rotation cup by performing a rinsing treatment with a rinsing liquid during rotation of the substrate.

According to a further embodiment of the present disclosure, there is provided a computer-readable recording medium. In the recording medium, a program, capable of operating in a computer, to control a cleaning apparatus is recorded. The program, when executed, allows the computer to control the cleaning apparatus in such a manner that the cleaning method according to another embodiment can be executed.

According to the present disclosure, a cleaning treatment on a substrate is performed by a chemical liquid and then a rinsing treatment is performed by a rinsing liquid while the substrate is rotated. Then, a drying treatment is performed by supplying a drying solvent to the substrate while the substrate is further rotated, and at the time when the drying treatment is performed, a cleaning liquid is supplied to a drain cup from a cleaning liquid supply device so as to clean the drain cup and a drain tube in a state where the cleaning liquid is not supplied to the substrate. Thus, it is possible to clean the drain cup or the drain tube after the drying treatment with the drying solvent, without prolonging the processing time. This makes it possible to prevent the drying liquid, such as IPA, from being mixed with the chemical liquid of the subsequent chemical treatment, and thus the chemical liquid can be collected without reducing the throughput.

Hereinafter, an embodiment of the present disclosure will be described in detail with reference to drawings.

Figure 1:
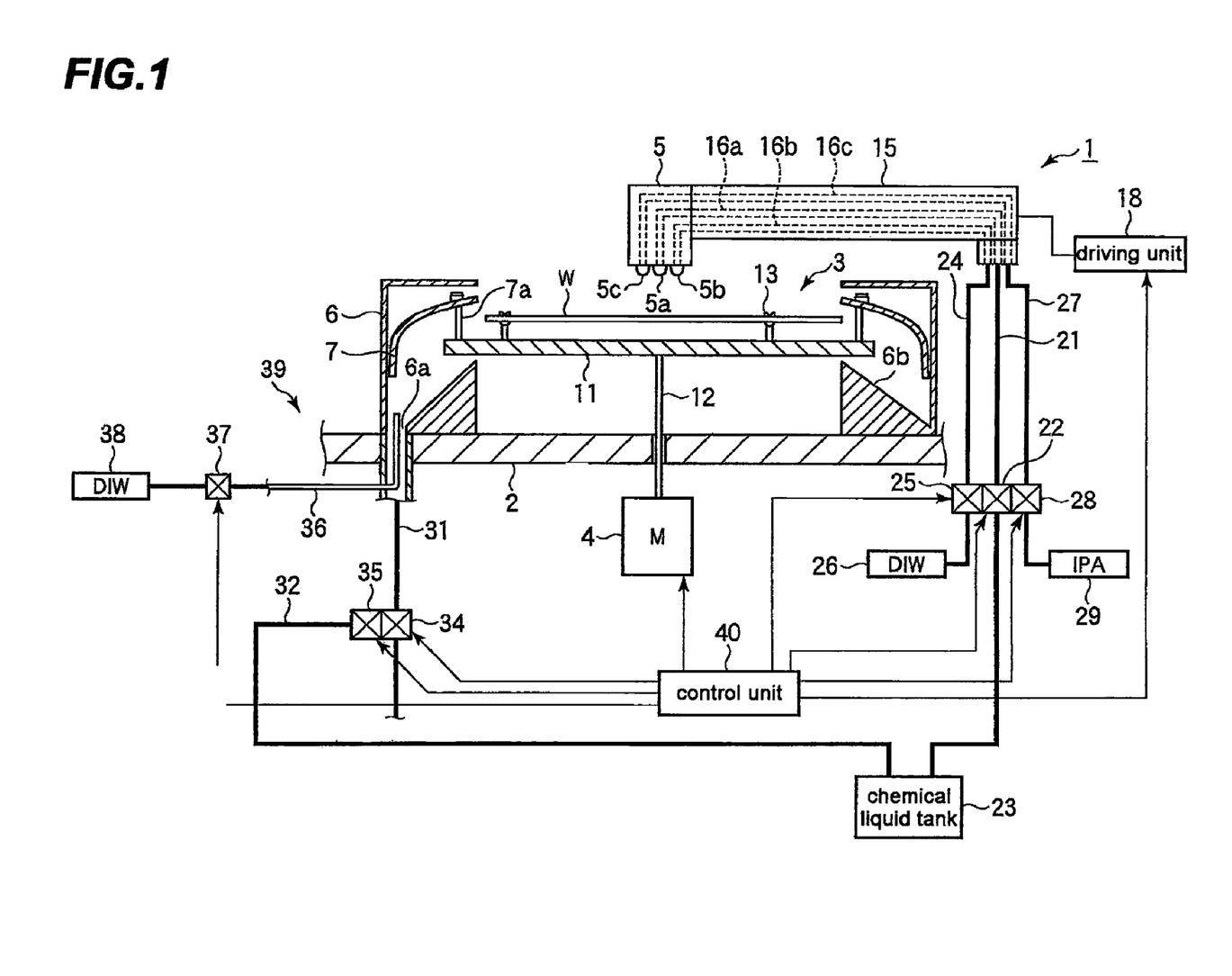
FIG. 1 is a cross-sectional view illustrating the schematic configuration of a cleaning apparatus according to one embodiment of the present disclosure.
Figure 2:
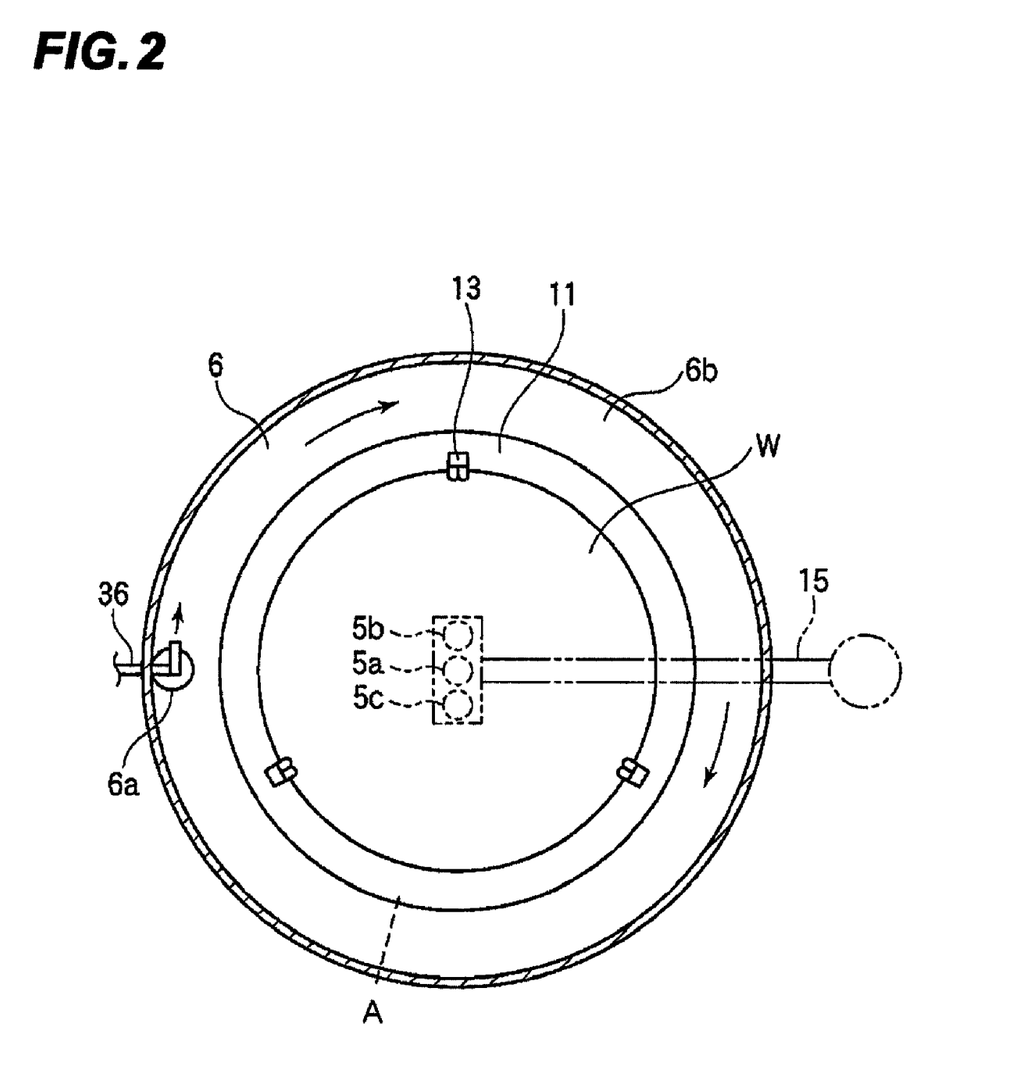
FIG. 2 is a schematic plan view of a cleaning apparatus according to one embodiment of the present disclosure

FIG. 1 is a cross-sectional view illustrating the schematic configuration of a cleaning apparatus according to one embodiment of the present disclosure, and FIG. 2 is a schematic plan view of FIG. 1. A cleaning apparatus 1 is designed for performing a cleaning treatment for removing fine particles or contaminants adhered to the surface of a semiconductor wafer (hereinafter, simply referred to as a wafer W) as a target substrate.

Cleaning apparatus 1 has a chamber (not shown), a base plate 2 functioning as a base of the chamber, and a spin chuck 3 provided within the chamber. Spin chuck 3 has a rotation plate 11, and a rotation shaft 12 connected to the center of rotation plate 11. At the circumferential periphery of rotation plate 11, three holding pins 13 for holding wafer W are mounted at equal intervals. Holding pin 13 horizontally holds wafer W in the state where wafer W is slightly apart from rotation plate 11, and is capable of moving between a holding position for holding wafer W and a releasing position for releasing the holding of wafer W by rotating backward. Also, at the circumferential periphery of rotation plate 11, three supporting pins (not shown) for supporting wafer W during the carrying of the wafer between a carrying arm (not shown) and spin chuck 3, are provided at equal intervals. Rotation shaft 12 extends downward by passing through base plate 2, and is rotatable by a motor 4. Then, when rotation plate 11 is rotated through rotation shaft 12 by motor 4, wafer W held by rotation plate 11 is rotated together with rotation plate.

At rotation plate 11, a rotation cup 7 is fixed by a screw 7a in such a manner that it can cover the mounted wafer W. Rotation cup 7 has a function of downwardly guiding a liquid outwardly shaken off from wafer W without scattering the liquid, by rotating together with rotation plate 11. However, it is optional to provide rotation cup 7.

Above spin chuck 3, a nozzle head 5 having a chemical liquid nozzle 5a for discharging a chemical liquid for cleaning wafer W to the surface of wafer W held by spin chuck 3, a deionized water nozzle 5b for discharging deionized water as a rinsing liquid, and an IPA nozzle 5c for discharging IPA as a drying solvent is provided. Nozzle head 5 is mounted on the leading end of a nozzle arm 15. Within nozzle arm 15 and nozzle head 5, a chemical liquid path 16a, a deionized water path 16b, and an IPA path 16c are formed, and they are connected to chemical liquid nozzle 5a, deionized water nozzle 5b, and IPA nozzle 5c, respectively. Nozzle arm 15 is rotatable by a driving unit 18, and the rotation of nozzle arm 15 by driving unit 18 moves nozzle head 5 between a discharge position right above wafer W and a stand-by position at the outside of wafer W.

A chemical liquid supply tube 21 is connected to chemical liquid path 16a, and a chemical liquid tank 23 storing a chemical liquid is connected to chemical liquid supply tube 21. Chemical liquid tank 23 stores a chemical liquid, such as diluted hydrofluoric acid (DHF) as an acidic chemical liquid, and ammonia-hydrogen peroxide solution (SC1) as an alkaline chemical liquid. At chemical liquid supply tube 21, an opening/closing valve 22 is provided. By operating opening/closing valve 22, the chemical liquid, provided from chemical liquid tank 23 via chemical liquid supply tube 21 and chemical liquid path 16a, is discharged from chemical liquid nozzle 5a.

A deionized water supply tube 24 is connected to deionized water path 16b, and a deionized water supply source 26 for supplying deionized water (DIW) is connected to deionized water supply tube 24. At deionized water supply tube 24, an opening/closing valve 25 is provided. By operating opening/closing valve 25, the deionized water, provided from deionized water supply source 26 via deionized water supply tube 24 and deionized water path 16b, is discharged from deionized water nozzle 5b.

An IPA supply tube 27 is connected to IPA path 16c, and an IPA supply source 29 for supplying IPA is connected to IPA supply tube 27. At IPA supply tube 27, an opening/closing valve 28 is provided. By operating opening/closing valve 28, the IPA, provided from IPA supply source 29 via IPA supply tube 27 and IPA path 16c, is discharged from IPA nozzle 5c.

At the outside of rotation plate 11, a drain cup 6 for receiving a draining liquid of a processing liquid scattered from wafer W is provided while surrounding rotation plate 11. At the bottom portion of drain cup 6, a drain hole 6a is formed, and a downwardly extending drain tube 31 is connected to drain hole 6a.

Figure 3:
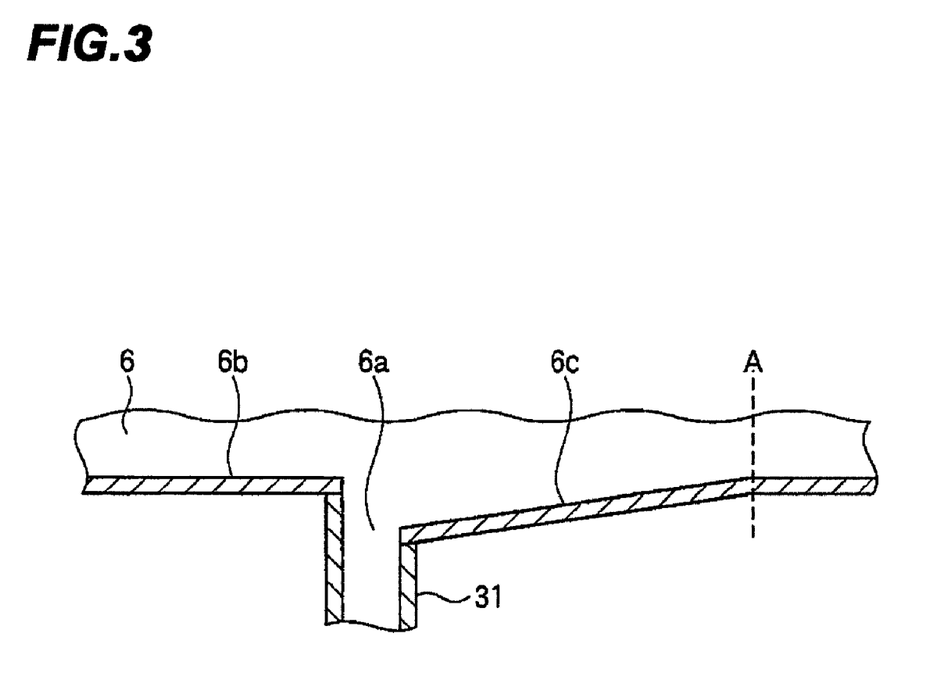
FIG. 3 is a diagram illustrating an example of a drain cup in the cleaning apparatus shown in FIG. 1.

In drain cup 6, the bottom portion of rotation cup 7 is inserted, and the draining liquid received in drain cup 6 is rotated on the bottom portion of drain cup 6 by the rotational force of rotation cup 7 and then is discharged from drain hole 6a to drain tube 31. Also, as shown in FIG. 3, slope 6c toward drain hole 6a may be formed along the circumferential direction from a point (for example, point A in FIG. 2) of bottom portion 6b of drain cup 6 so as to guide draining liquid to drain hole 6a.

Also, a collecting tube 32 for collecting a chemical liquid is branched from drain tube 31. Collecting tube 32 is connected to chemical liquid tank 23 so that the chemical liquid can be collected in chemical liquid tank 23 via the collecting tube.

At the point of drain tube 31, where collecting tube 32 is branched, an opening/closing valve 34 is provided, and also, at the vicinity of the branched point of collecting tube 32, an opening/closing valve 35 is provided. In the state where opening/closing valve 34 is opened and opening/closing valve 35 is closed, the draining liquid is sent to a drainage disposal apparatus via drain tube 31, and then is wasted. Also, in the state where opening/closing valve 34 is closed and opening/closing valve 35 is opened, the draining liquid is sent to chemical liquid tank 23 via collecting tube 32.

In the upper portion of drain tube 31, a cleaning liquid tube 36 for supplying deionized water (DIW), as a cleaning liquid, to drain cup 6 from the outside is inserted. Cleaning liquid tube 36 is upwardly bent within drain tube 31 and extends to the position in the vicinity of the bottom portion of drain cup 6 within drain cup 6. Also, cleaning liquid tube has a portion of approximately 1 cm, which is further horizontally bent from the above mentioned bottom portion position in the rotational direction of wafer W, as shown in FIG. 2. Then, from the leading end of cleaning liquid tube 36, deionized water (a cleaning liquid) for cleaning drain cup 6 and drain tube 31 is discharged while being not supplied to wafer W. Accordingly, from the cleaning liquid tube 36, the deionized water (the cleaning liquid) is discharged in the rotational direction of wafer W. After circulating on bottom portion 6b of drain cup 6, the discharged deionized water is discharged from drain hole 6a.

At the other end of cleaning liquid tube 36, a cleaning liquid supply source 38 for supplying deionized water (DIW) as a cleaning liquid is connected. In cleaning liquid tube 36, an opening/closing valve 37 is provided, and the opening of opening/closing valve 37 discharges the deionized water (the cleaning liquid) into drain cup 6 from cleaning liquid supply source 38 via cleaning liquid tube 36.

Cleaning liquid tube 36, cleaning liquid supply source 38, and opening/closing valve 37 constitute a cleaning liquid supply device 39 for cleaning the inner walls of drain cup 6 and drain tube 31.

Figure 4:
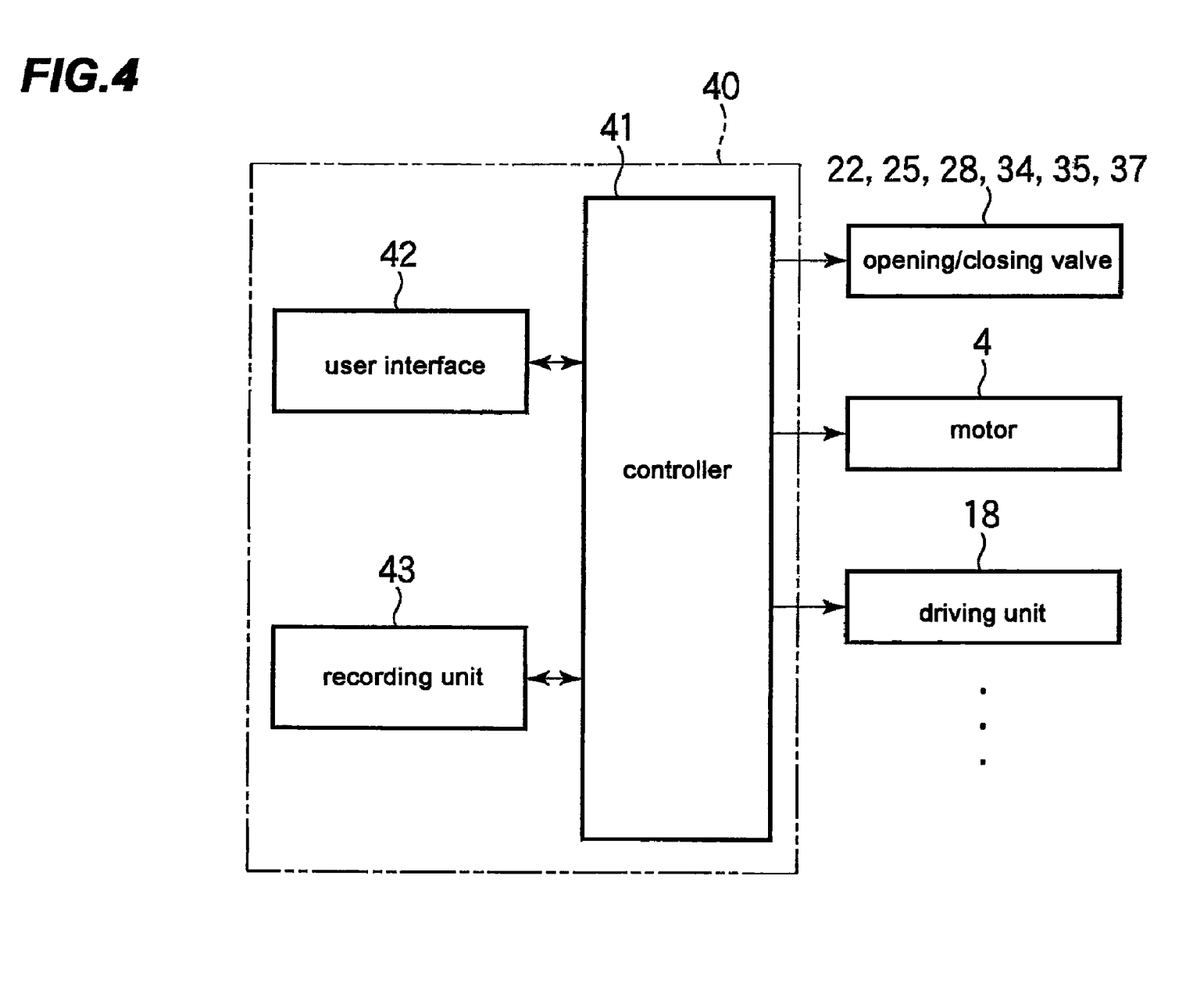
FIG. 4 is a block diagram illustrating the configuration of a control unit provided in the cleaning apparatus shown in FIG. 1.

Cleaning apparatus 1 includes a control unit 40. Control unit 40, as shown in the block diagram in FIG. 4, has a controller 41, a user interface 42, and a recording unit 43. Controller 41 includes a micro processor (a computer), and controls respective components of cleaning apparatus 1, for example, opening/closing valves 22, 25, 28, 34, 35, and 37, motor 4, the driving motor 18 and the like. User interface 42 is connected to controller 41, and includes a keyboard through which an operator performs the operation of input (such as commands) to manage cleaning apparatus 1, a display for visually displaying the running state of cleaning apparatus 1 and the like. Recording unit 43 is also connected to controller 41, and includes, therewithin, a processing recipe, such as a control program for controlling target objects of the respective components of cleaning apparatus 1, or a program for allowing cleaning apparatus 1 to perform a certain treatment. The processing recipe is recorded in a recording medium within recording unit 43. The recording medium may be a fixed-type medium, such as hard disk, or a transferable-type medium, such as CD ROM, DVD, flash memory, and the like. Also, the recipe may be appropriately transmitted from another device, for example, via a dedicated line. Also, controller 41, as required, retrieves any processing recipe from recording unit 43 in accordance with the instruction and the like, from user interface 42, and executes it, thereby performing a certain treatment under the control of controller 41.

Figure 5:
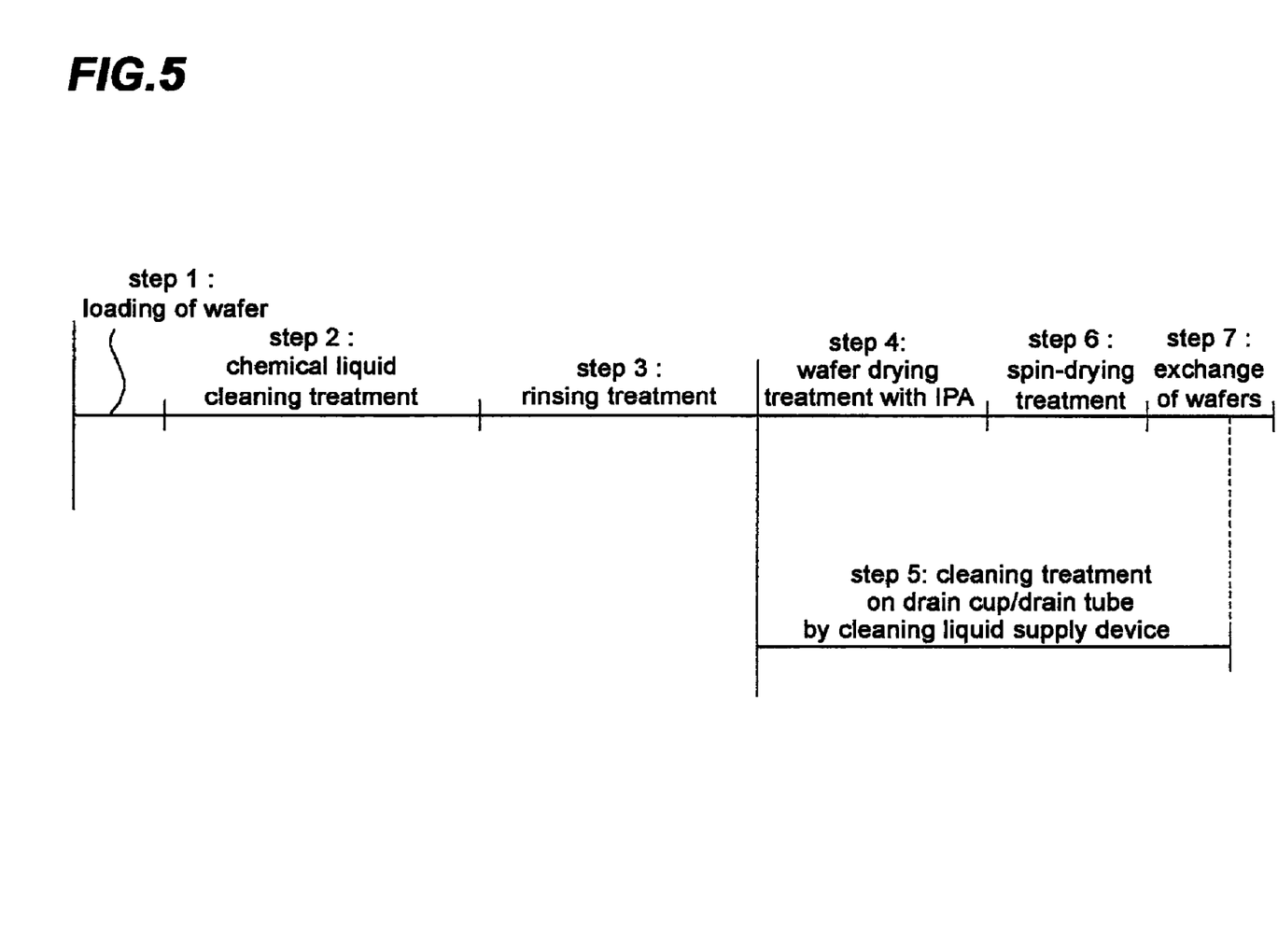
FIG. 5 is a timing chart for illustrating a cleaning method performed by the cleaning apparatus shown in FIG. 1.

Then, hereinafter, the cleaning method performed by cleaning apparatus 1 will be described based on the timing chart shown in FIG. 5. First, a wafer W as a target object is loaded and is mounted on spin chuck 3 (step 1).

In this state, first, a cleaning treatment on wafer W is performed by a chemical liquid (step 2). In this step, nozzle arm 15 is rotated to position nozzle head 5 at the discharge position, and chemical liquid nozzle 5a is adjusted to be positioned right above the center of wafer W. Spin chuck 3 rotates wafer W while opening/closing valve 22 is opened, and then a chemical liquid for cleaning wafer W, such as diluted hydrofluoric acid (DHF) as an acidic chemical liquid or ammonia-hydrogen peroxide solution (SC1) as an alkaline chemical liquid, is supplied from chemical liquid tank 23 to chemical liquid nozzle 5a via chemical liquid supply tube 21 and chemical liquid path 16a, and is discharged from chemical liquid nozzle 5a to the surface of wafer W. Accordingly, the chemical liquid is spread over the entire surface of wafer W, and then forms a liquid film, thereby cleaning the surface of wafer W. When the chemical liquid supplied to the surface of wafer W is drained off by shaking off outward, the draining liquid is guided to rotation cup 7, flows downward, and is received by drain cup 6. Then, the draining liquid received in drain cup 6 is rotated by the rotational force of rotation cup 7, and then is discharged to drain tube 31 from drain hole 6a. Also, as shown in FIG. 3, the draining liquid may be discharged by using slope 6c formed at bottom portion 6b of drain cup 6. Herein, at predetermined time, by closing opening/closing valve 34, and opening opening/closing valve 35, the draining liquid discharged to drain tube 31 is returned to chemical liquid tank 23 via collecting tube 32. This may contribute to the re-use of the chemical liquid.

Then, the discharge of the chemical liquid is stopped by closing opening/closing valve 22. When the cleaning treatment with the chemical liquid is completed, a rinsing treatment on wafer W by deionized water is performed (step 3). In this rinsing treatment, the position of nozzle head 5 is adjusted so that deionized water nozzle 5b is positioned right above the center of wafer W. Opening/closing valve 25 is opened while wafer W is rotated, and then the deionized water as a rinsing liquid is supplied from deionized water supply source 26 to deionized water nozzle 5b via deionized water supply tube 24 and deionized water path 16b, and is discharged from deionized water nozzle 5b to the surface of wafer W. Accordingly, the chemical liquid on wafer W is washed by the deionized water. When the deionized water supplied to the surface of wafer W, mixed with the chemical liquid, is drained off by shaking off outward, the draining liquid is guided to rotation cup 7, flows downward, and is received by drain cup 6 in the same manner as the draining liquid in the cleaning treatment. Then, the draining liquid received in drain cup 6 is rotated by the rotational force of rotation cup 7, and then is discharged to drain tube 31 from drain hole 6a. Also, as shown in FIG. 3, the draining liquid may be discharged by using slope 6c formed at bottom portion 6b of drain cup 6. Herein, by closing opening/closing valve 35 and opening opening/closing valve 34, the draining liquid discharged to drain tube 31 is sent to a drainage disposal apparatus (not shown) provided in the downstream area of drain tube 31. Then, in the drainage disposal apparatus, the draining liquid is disposed of and wasted.

The discharge of the deionized water is stopped by closing opening/closing valve 25. When the rinsing treatment is completed, a drying treatment on wafer W is performed by IPA, which is a drying solvent having a lower surface tension than water (step 4). In this drying treatment, the position of nozzle head 5 is adjusted so that IPA nozzle 5c is positioned right above the center of wafer W. Opening/closing valve 28 is opened while wafer W is rotated, and then IPA as a drying solvent is supplied from the IPA source 29 to IPA nozzle 5c via IPA supply tube 27 and IPA path 16c, and is discharged from IPA nozzle 5c to the surface of wafer W. Accordingly, the deionized water on the surface of the wafer can be dried without leaving spots, thereby inhibiting the occurrence of watermarks and the like. Especially, this IPA drying treatment is effective in a drying treatment on a wafer which is likely to leave watermarks because its surface becomes hydrophobic after a cleaning treatment with DHF, which is a hydrophobic chemical liquid.

In the drying treatment with IPA as a drying solvent, IPA is shaken off from wafer W and is scattered into drain cup 6, and thus the IPA remains adhered to the inner walls of drain cup 6 and drain tube 31. In a prior art, in that state, a chemical liquid treatment on the subsequent wafer is performed. Thus, a chemical liquid, which has been shaken off from wafer W and received in drain cup 6, is inevitably mixed with IPA, when discharged from drain tube 31. Thus, this chemical liquid cannot be reused and cannot help being wasted.

Therefore, in the present embodiment, cleaning liquid supply device 39 is provided, and opening/closing valve 37 is opened during the drying treatment on wafer W with IPA in step 4 so that deionized water as a cleaning liquid is discharged from cleaning liquid supply source 38 into drain cup 6 via cleaning liquid tube 36 while being not supplied to wafer W. Then, by the deionized water, the inner walls of drain cup 6 and drain tube 31 are cleaned (step 5). Herein, from a portion of cleaning liquid tube 36, which is horizontally bent on the position in the vicinity of the bottom portion within drain cup 6 in the rotational direction of wafer W, the deionized water (the cleaning liquid) is discharged in the rotational direction of wafer W. After circulating on bottom portion 6b of drain cup 6 by the rotational force of rotation cup 7, the discharged deionized water is discharged from drain hole 6a. Also, as shown in FIG. 3, the draining liquid may be discharged by using slope 6c formed at bottom portion 6b of drain cup 6.

As described above, at the time when the drying treatment with IPA is performed, cleaning liquid supply device 39 separate from the processing liquid nozzle head 5 can clean drain cup 6 and drain tube 31 without interfering with the drying treatment of wafer W. Accordingly, it is possible to clean drain cup 6 and drain tube 31 without requiring an additional cleaning time and reducing the throughput. This may contribute to the reuse of a chemical liquid by reducing the amount of IPA which is mixed with a draining liquid in the subsequent chemical liquid treatment. Also, since this cleaning treatment is performed during the cleaning treatment with IPA, as described above, it is possible to remove the IPA adhered to the drain cup and the like, before the IPA is strongly adhered, thereby improving the cleaning ability.

Then, the supply of the IPA is stopped by closing opening/closing valve 28, and wafer W is rotated at a high speed, thereby performing a spin-drying treatment (step 6).

After the drying is stopped by stopping the rotation of wafer W, wafer W is unloaded and the subsequent wafer W is loaded (exchange of wafers; step 7). Then, for the subsequent wafer W, the above described steps are repeated.

Between steps 6 and 7, the cleaning treatment for drain cup 6 and drain tube 31 in step 5 is continued. Accordingly, the IPA adhered on drain cup 6 and drain tube 31 can be highly efficiently removed, thereby significantly reducing the amount of IPA which is mixed with the discharged chemical liquid in the chemical liquid treatment on the subsequent wafer W. Also, it is not necessarily required to perform step 5 for the entire period of steps 6 and 7, and step 5 may be performed until a point of step 6 or step 7. Also, if the cleaning ability can be secured to the required extent, step 5 may be stopped at the end point of step 4. Also, the cleaning treatment for drain cup 6 and drain tube 31 performed by cleaning liquid supply device 39 in step 5 may be started during the rinsing treatment in step 3 is performed.

Also, in cleaning apparatus 1 according to the present embodiment, since rotation cup 7 is provided, the IPA may be adhered to the inner surface of rotation cup 7 during the drying treatment with the IPA in step 4, or the IPA adhered to the inner surface of rotation cup 7 may have a bad influence on the collection of the chemical liquid. In this case, preferably, the IPA adhered to the inner surface of rotation cup 7 is also required to be removed by cleaning, but it is difficult to clean the inner surface of rotation cup 7 by cleaning liquid supply device 39. Thus, in this case, before the cleaning treatment with the chemical liquid is performed after the loading of the subsequent wafer in cleaning apparatus 1, it is preferable to perform a pre-rinsing treatment with discharging deionized water as a rinsing liquid from deionized water nozzle 5b while wafer W is rotated. Through such a pre-rinsing treatment, the deionized water scattered from wafer W can reach the inner surface of rotation cup 7 and wash off the IPA adhered to it.

Figure 6:
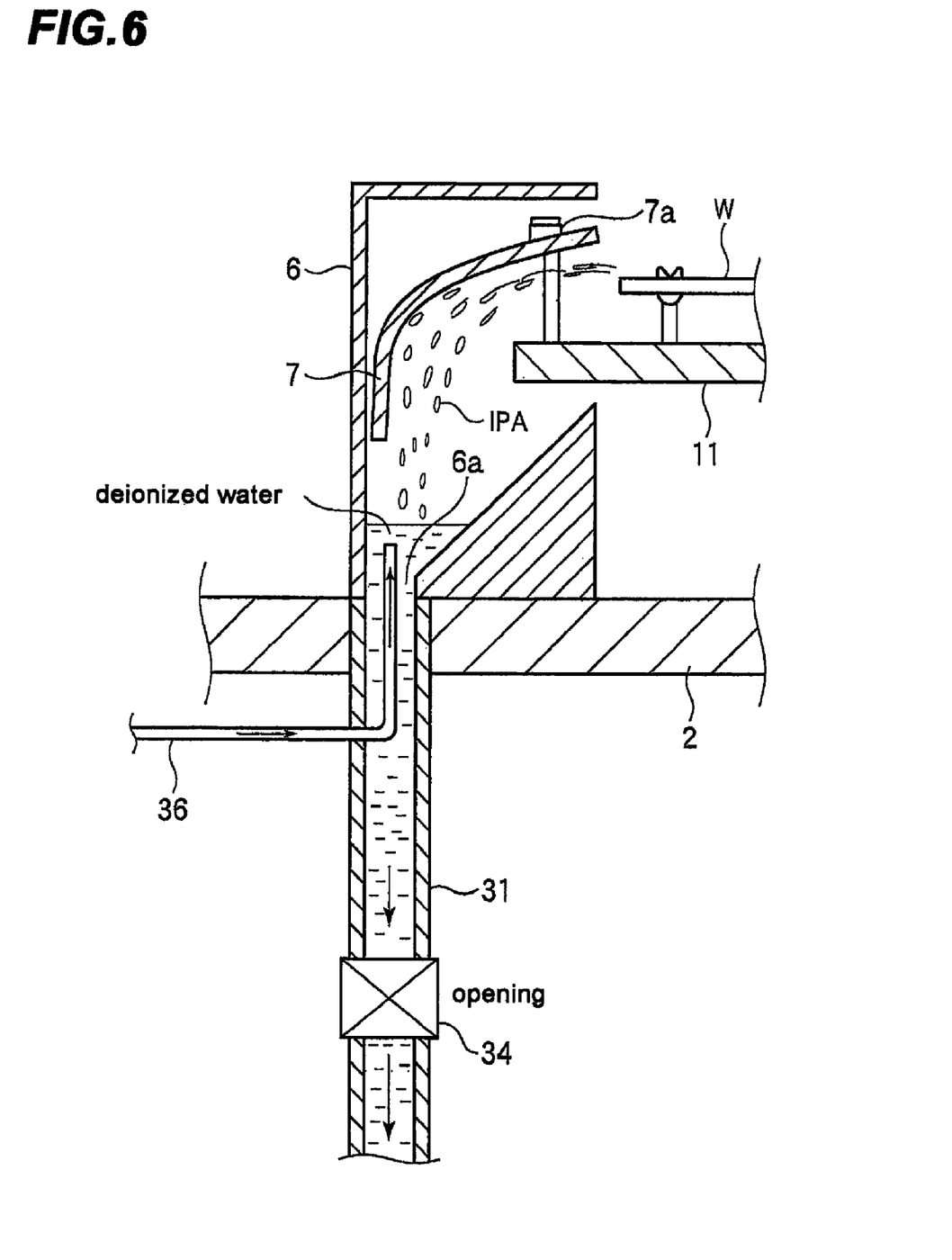
FIG. 6 is a diagram for illustrating an example of a cleaning treatment on a drain cup and a drain tube.

Hereinafter, an example of the cleaning treatment on drain cup 6 and drain tube 31 will be described in detail. First, during the IPA drying treatment of wafer W, as shown in FIG. 6, in the state where opening/closing valve 35 is closed and opening/closing valve 34 is opened, the deionized water as a cleaning liquid is discharged from cleaning liquid supply source 38 into drain cup 6 via cleaning liquid tube 36 by opening opening/closing valve 37. Accordingly, the discharged deionized water is rotated within drain cup 6 by a rotational force of rotating rotation plate 11 and cleans the inside of drain cup 6 by dissolving the IPA. Then, the deionized water including the IPA dissolved therein flows into drain tube 31, thereby cleaning drain tube 31.

Figure 7:
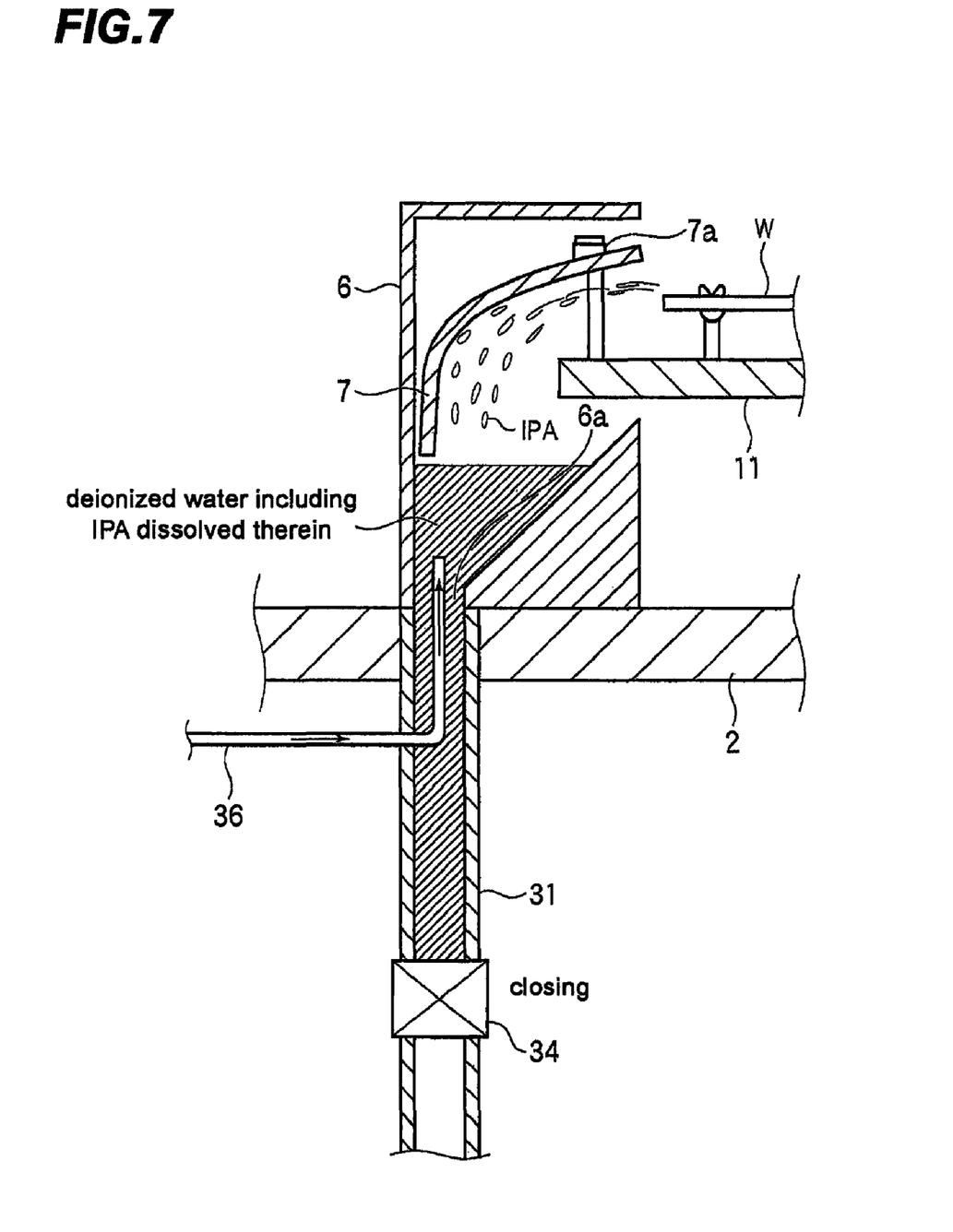
FIG. 7 is a diagram for illustrating an example of a cleaning treatment on a drain cup and a drain tube.
Figure 8:
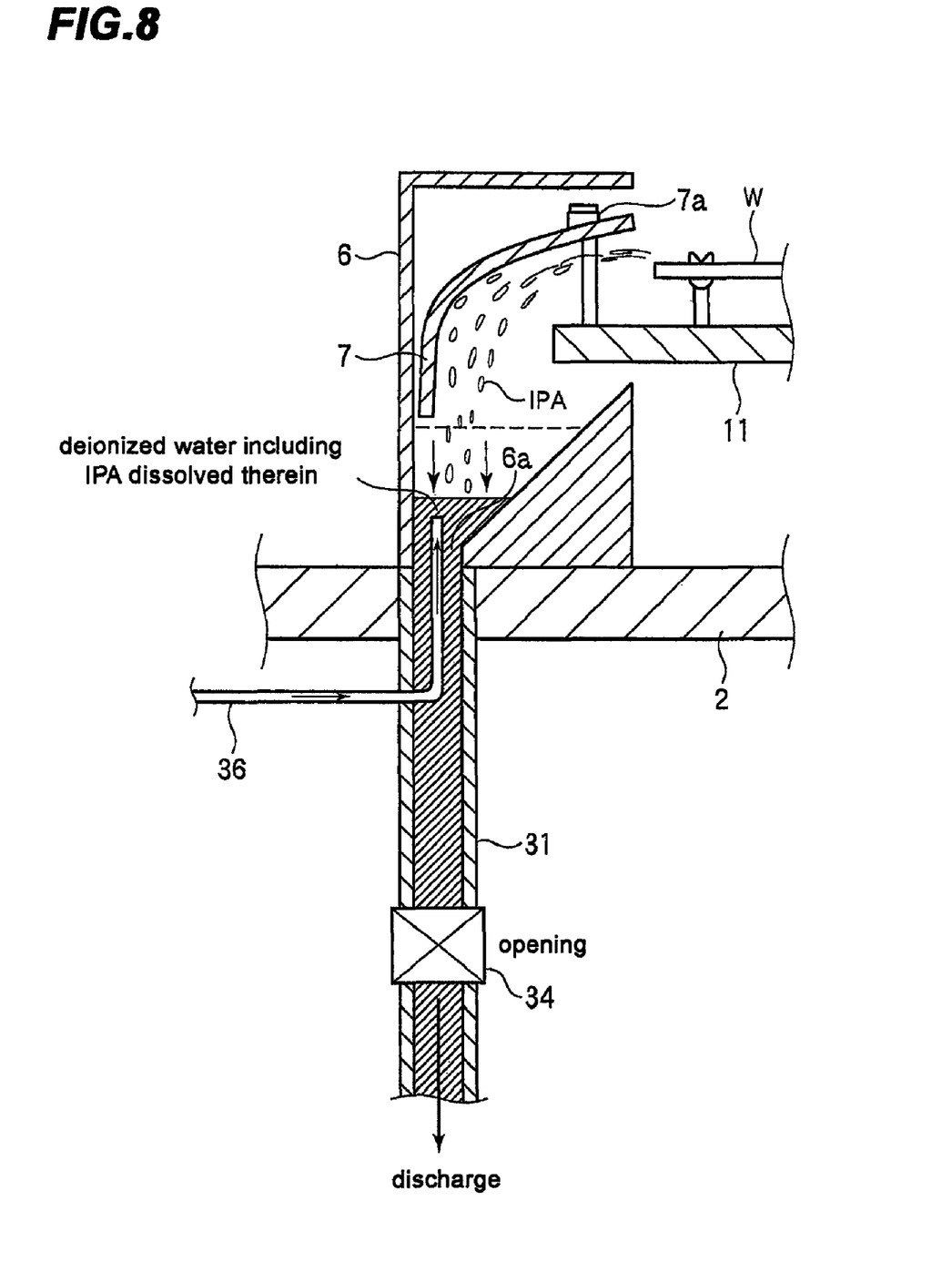
FIG. 8 is a diagram for illustrating an example of a cleaning treatment on a drain cup and a drain tube.
Figure 9:
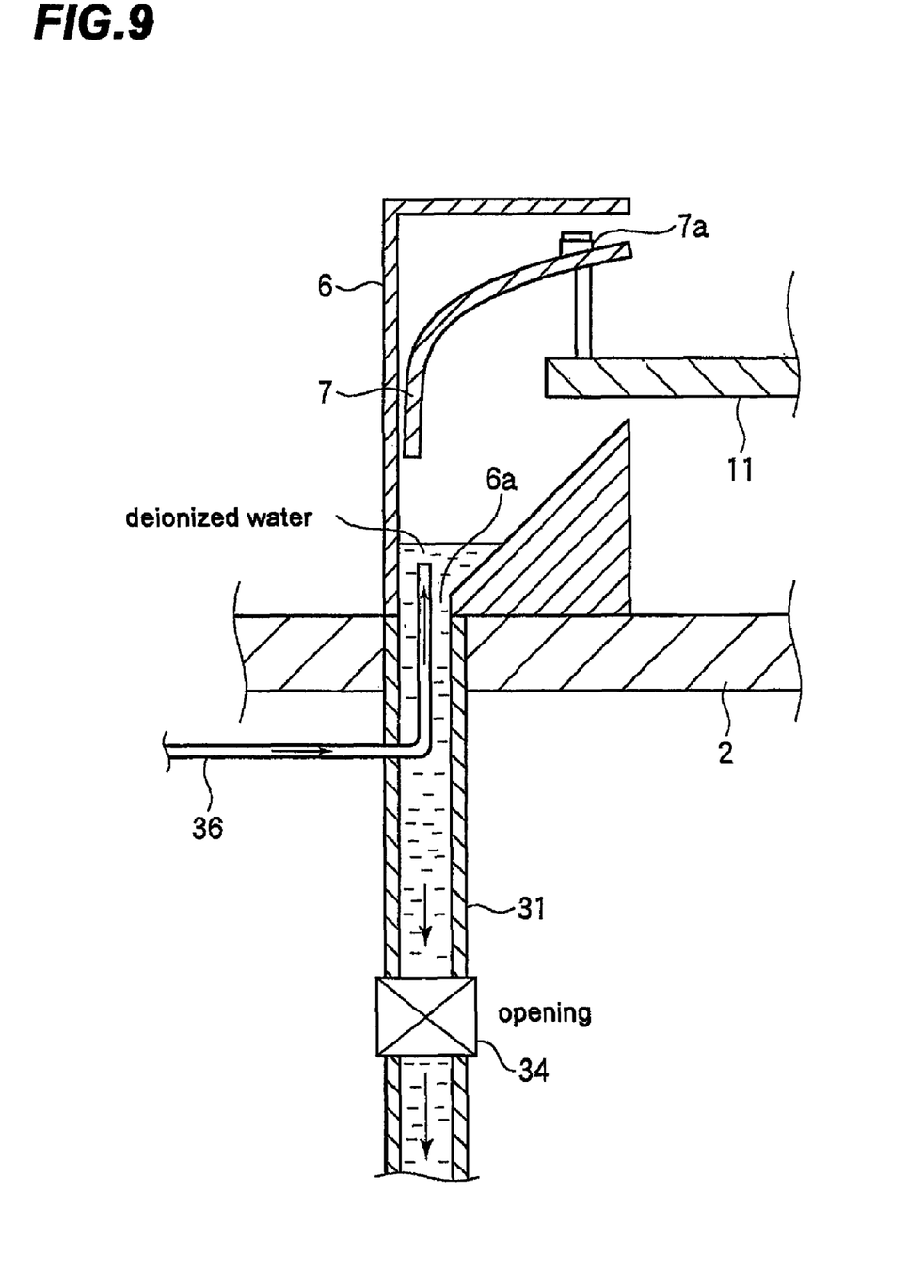
FIG. 9 is a diagram for illustrating an example of a cleaning treatment on a drain cup and a drain tube.

Then, as shown in FIG. 7, opening/closing valve 34 is closed, and drain cup 6 and drain tube 31 are placed in a state in which they store the deionized water (the cleaning liquid) including the IPA sufficiently dissolved therein. Next, as shown in FIG. 8, the stored deionized water is discharged by opening opening/closing valve 34. The operations shown in FIGS. 7 and 8 are repeatedly performed at predetermined times. Also, as shown in FIG. 9, at predetermined time during the spin-drying step (step 6) or the exchange of wafers W (step 7) after the supply of the IPA to wafer W is stopped, the deionized water stored in drain cup 6 and drain tube 31 is finally quickly discharged by opening opening/closing valve 34. Through the operation of the cleaning treatment, drain cup 6 and drain tube 31 can be highly efficiently cleaned. Also, herein, since the drying treatment with the IPA has been already completed, the IPA is not newly mixed, thereby achieving a very high cleaning ability.

In this description, in cleaning drain cup 6 and drain tube 31, after the cleaning treatment is performed by flowing the cleaning liquid, the storage and discharge of the cleaning liquid are alternated. However, the present disclosure is not limited thereto. The cleaning of drain cup 6 and drain tube 31 may be performed by only the cleaning treatment with the flowing of the cleaning liquid, or by only the alternation of the storage and discharge of the cleaning liquid.

As described above, according to the present embodiment, since the cleaning treatment of drain cup 6 and drain tube 31 is performed by cleaning liquid supply device 39 separate from the processing liquid nozzle head 5 during step 4 for the drying treatment on wafer W with the IPA as a drying solvent, it is possible to prevent the IPA from being mixed in the chemical treatment on the subsequent wafer W without requiring the additional time for cleaning drain cup 6 and drain tube 31. Thus, it is possible to collect the chemical liquid in the chemical treatment on the subsequent wafer W without reducing the throughput. Also, since drain cup 6 and drain tube 31 are cleaned during the drying treatment on wafer W with the IPA, a very high cleaning ability is achieved.

Figure 10:
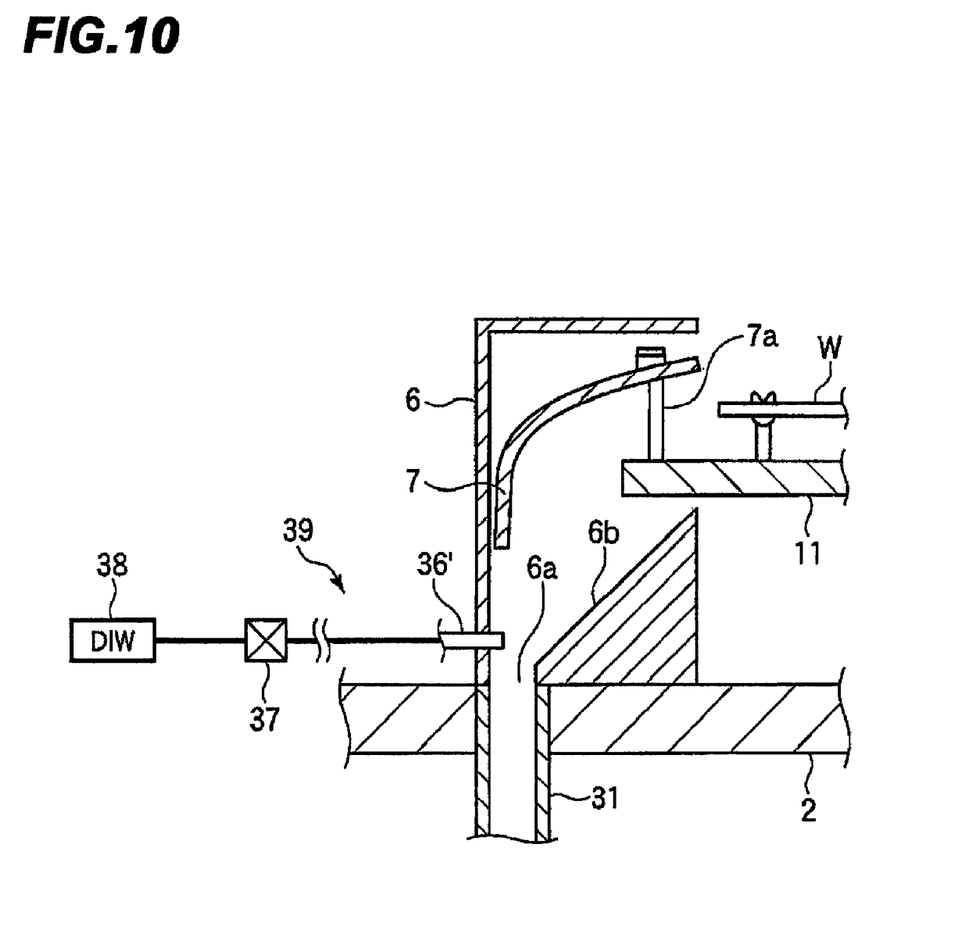
FIG. 10 is a partial cross-sectional view for illustrating an example of a cleaning liquid supply device.
Figure 11:
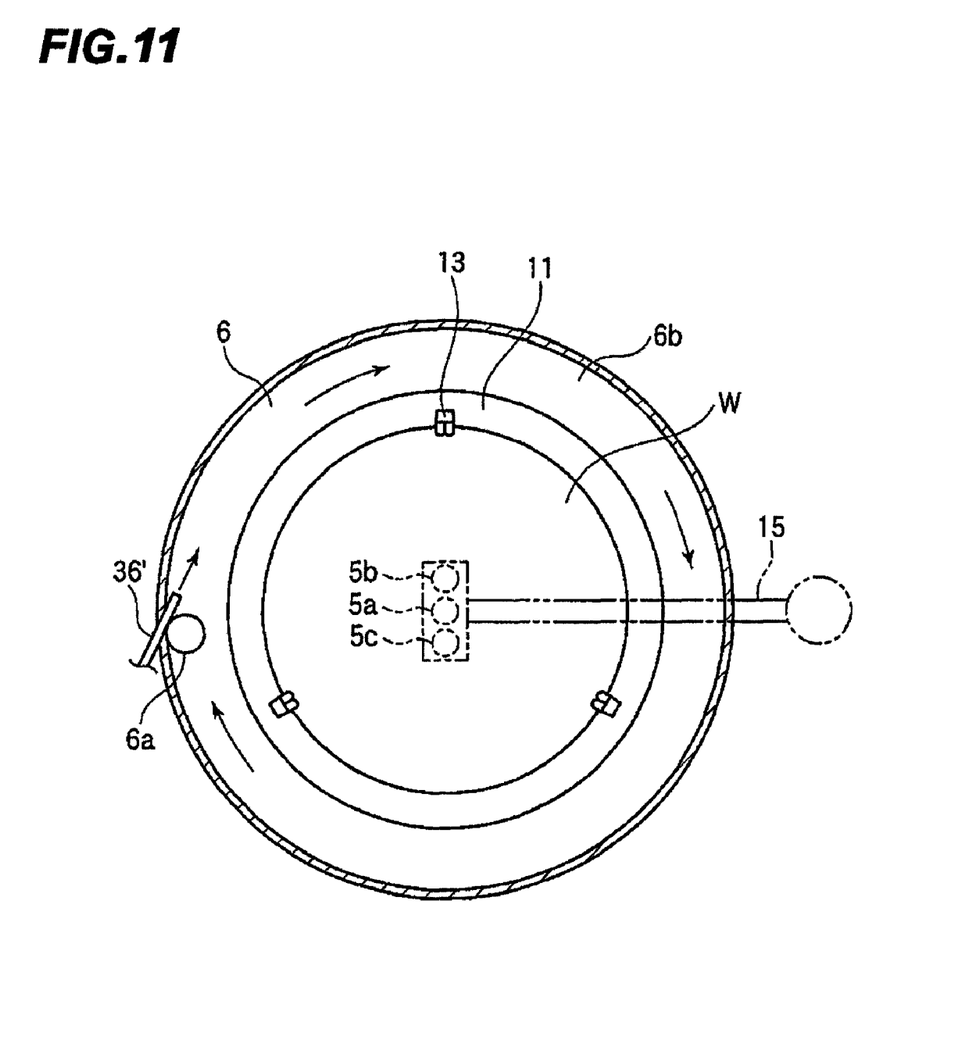
FIG. 11 is a schematic plan view for illustrating an example of a cleaning liquid supply device.

Hereinafter, another example of cleaning liquid supply device 39 will be described. In the above described embodiment, cleaning liquid supply device 39 has cleaning liquid tube 36, which is provided to extend to the position in the vicinity of the bottom portion within drain cup 6 via drain tube 31, and, from a portion of cleaning liquid tube 36, which is horizontally bent in the rotational direction of wafer W, the deionized water (the cleaning liquid) is discharged in the rotational direction of wafer W. However, in the present embodiment, as shown in the partial cross-sectional view of FIG. 10 and the schematic plan view of FIG. 11, cleaning liquid supply device 39 has cleaning liquid tube 36', which is inserted directly from the outside to the position in the vicinity of bottom portion 6b and drain hole 6a of drain cup 6 so as to discharge deionized water (a cleaning liquid) in the rotational direction of wafer W. Accordingly, by a simple tube structure, deionized water can be discharged, and then, after circulating on drain cup 6, the discharged deionized water can be discharged from drain hole 6a.

Also, the present disclosure is not limited to the above described embodiment, and various modifications can be made. For example, in the embodiment, a cleaning apparatus for cleaning the surface of a wafer W is exemplified. However, the present disclosure is not limited thereto, and is applicable to another cleaning apparatus for cleaning the backside or the inside and outside of wafer W. Also, in the embodiment, IPA as a drying solvent is used, but the present disclosure is not limited thereto. Any other solvents having a lower surface tension than water, such as methanol, may be applicable. Also, in the above described embodiment, although a semiconductor wafer as a target substrate is used, the present disclosure is applicable to any other substrates, such as a substrate for a flat panel display (FPD), which is a representative glass substrate used for a liquid crystal display device (LCD).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A cleaning method to perform a cleaning treatment on a substrate in a state where the substrate is rotatably held by a holding device, a drain cup to receive a draining liquid shaken off from the substrate is disposed surrounding a circumferential periphery of the substrate held by the holding device, and a drain tube to discharge the draining liquid within the drain cup is provided in the drain cup, the method comprising:

a cleaning step to clean the substrate by supplying a chemical liquid to the substrate during rotation of the substrate;

a rinsing step, after the cleaning step, to perform a rinsing treatment of the substrate by supplying a rinsing liquid to the substrate during rotation of the substrate;

a drying step, after the rinsing step, to perform a drying treatment of the substrate by supplying a drying solvent to the substrate during rotation of the substrate; and a cleaning step to clean the drain cup and the drain tube by supplying a cleaning liquid from a cleaning liquid supply device to the drain cup in a state where the cleaning liquid is not supplied to the substrate, at a time when the drying step is performed, wherein the cleaning liquid used to clean the drain cup and the drain tube is discharged to the drain cup from a bottom portion of the drain cup lower than the substrate, wherein the cleaning liquid has a different ingredient from the chemical liquid used at the cleaning step to clean the substrate, and wherein the cleaning liquid washes out the drying solvent used at the drying step, thereby reducing an amount of the drying solvent mixed with the chemical liquid in the cleaning step of a subsequent substrate.

2. The cleaning method as claimed in claim 1, wherein in the cleaning step to clean the drain cup and the drain tube, the cleaning liquid is supplied to the drain cup from when the supply of the drying solvent to the substrate is stopped to when the substrate is exchanged with a subsequent substrate.

3. The cleaning method as claimed in claim 1, wherein in the cleaning step to clean the drain cup and the drain tube, the cleaning liquid is supplied to the drain cup during the rinsing step to perform a rinsing treatment of the substrate.

4. The cleaning method as claimed in claim 1, wherein in the cleaning step to clean the drain cup and the drain tube, the cleaning liquid is discharged toward the drain cup in a rotational direction of the substrate.

5. The cleaning method as claimed in claim 1, wherein in the cleaning step to clean the drain cup and the drain tube, the cleaning liquid is discharged into the drain cup and then discharged from the drain cup after circulating on the drain cup.

6. The cleaning method as claimed in claim 1, wherein in the cleaning step to clean the drain cup and the drain tube, the cleaning liquid is supplied to the drain cup from the cleaning liquid supply device while a draining liquid flows from the drain tube.

7. The cleaning method as claimed in claim 1, wherein the drain tube is provided with a valve; and in the cleaning step to clean the drain cup and the drain tube, storage of the cleaning liquid in the drain cup and the drain tube by supplying of the cleaning liquid to the drain cup by the cleaning liquid supply device with the valve being closed, and discharge of the cleaning liquid stored in the drain cup and the drain tube by opening of the valve, are alternately performed.

8. The cleaning method as claimed in claim 1, wherein the drain tube is provided with a valve; and in the cleaning step to clean the drain cup and the drain tube, the cleaning liquid is supplied to the drain cup by the cleaning liquid supply device while a draining liquid flows from the drain tube, and then storage of the cleaning liquid in the drain cup and the drain tube by supplying of the cleaning liquid to the drain cup by the cleaning liquid supply device with the valve being closed, and discharge of the cleaning liquid stored in the drain cup and the drain tube by opening of the valve, are alternately performed.

9. The cleaning method as claimed in claim 1, wherein a rotation cup surrounding the substrate held by the holding device is disposed, the rotation cup being rotatable together with the substrate, the method further comprising, prior to the cleaning treatment of the substrate by the chemical liquid, a cleaning step to clean an inner surface of the rotation cup by performing a rinsing treatment with a rinsing liquid during rotation of the substrate.

10. A computer-readable recording medium, in which a program, capable of operating in a computer, to control a cleaning apparatus is recorded, wherein the program, when executed, allows the computer to control the cleaning apparatus in such a manner that the cleaning method as claimed in claim 1 is executed.

* * * * *